United States Patent
Kim

(10) Patent No.: US 9,589,668 B2
(45) Date of Patent: Mar. 7, 2017

(54) SEMICONDUCTOR MEMORY DEVICE FOR PERFORMING TEST OPERATION OF CIRCUITS RELATED TO REPAIR SCHEME AND OPERATING METHOD THEREOF

(71) Applicant: SK hynix Inc., Gyeonggi-do (KR)

(72) Inventor: Sang-Hee Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/572,305

(22) Filed: Dec. 16, 2014

(65) Prior Publication Data

US 2016/0005496 A1 Jan. 7, 2016

(30) Foreign Application Priority Data

Jul. 3, 2014 (KR) ........................ 10-2014-0083071

(51) Int. Cl.
| | |
|---|---|
| *G11C 29/00* | (2006.01) |
| *G11C 29/18* | (2006.01) |
| *G11C 17/16* | (2006.01) |
| *G11C 29/24* | (2006.01) |
| *G11C 29/44* | (2006.01) |
| G11C 29/20 | (2006.01) |
| G11C 29/12 | (2006.01) |

(52) U.S. Cl.
CPC .............. *G11C 29/00* (2013.01); *G11C 17/16* (2013.01); *G11C 29/18* (2013.01); *G11C 29/24* (2013.01); *G11C 29/44* (2013.01); *G11C 29/78* (2013.01); *G11C 29/20* (2013.01); *G11C 2029/1202* (2013.01); *G11C 2029/4402* (2013.01)

(58) Field of Classification Search
CPC .......... G11C 29/78; G11C 29/04; G11C 17/16
See application file for complete search history.

(56) References Cited

U.S. PATENT DOCUMENTS

| | | | | |
|---|---|---|---|---|
| 5,771,195 | A * | 6/1998 | McClure ................ | G11C 29/24 365/200 |
| 6,728,910 | B1 * | 4/2004 | Huang ................... | G11C 29/16 365/200 |
| 2002/0031017 | A1 * | 3/2002 | Yumoto ................ | G11C 29/835 365/200 |
| 2004/0064767 | A1 * | 4/2004 | Huckaby ................ | G11C 29/72 714/710 |
| 2005/0188287 | A1 * | 8/2005 | Combs ................... | G11C 29/24 714/718 |
| 2005/0270866 | A1 * | 12/2005 | Ouellette ............... | G11C 29/14 365/200 |
| 2006/0294443 | A1 * | 12/2006 | Fekih-Romdhane .. | G11C 29/20 714/738 |

(Continued)

FOREIGN PATENT DOCUMENTS

KR 1019980014814 5/1998

*Primary Examiner* — Harry W Byrne
*Assistant Examiner* — Ajay Ojha
(74) *Attorney, Agent, or Firm* — IP & T Group LLP

(57) ABSTRACT

A semiconductor memory device includes a memory cell array including a plurality of word lines; a repair fuse section programmed with one or more repair-target addresses and fuse enable information; an address generation section suitable for generating test addresses during a test operation, corresponding to the word lines based on the repair-target addresses and the fuse enable information; and a word line control section suitable for selectively activating the word lines based on the test addresses.

18 Claims, 7 Drawing Sheets

(56) References Cited

U.S. PATENT DOCUMENTS

2010/0110809 A1* 5/2010 Kobayashi ........... G11C 29/848
365/200
2012/0327724 A1* 12/2012 Kawakubo ............... G11C 8/08
365/189.07

* cited by examiner

SEMICONDUCTOR MEMORY DEVICE FOR PERFORMING TEST OPERATION OF CIRCUITS RELATED TO REPAIR SCHEME AND OPERATING METHOD THEREOF

CROSS-REFERENCE TO RELATED APPLICATIONS

The present application claims priority of Korean Patent Application No. 10-2014-0083071, filed on Jul. 3, 2014, which is incorporated herein by reference in its entirety.

BACKGROUND

1. Field

Various embodiments of the present invention relate to a semiconductor design technology, and more particularly, to a semiconductor memory device with a repair scheme.

2. Description of the Related Art

Generally, semiconductor memory devices such as a double data rate synchronous dynamic random access memory (DDR SDRAM), have a plurality of memory cells. The number of the memory cells is increasing as the process technology for fabricating the semiconductor memory devices is developing. Thus, the integration degree of the semiconductor devices is increasing. When one of the memory cells fails, the semiconductor memory device may not perform the intended operation and should be discarded. However, it is not cost efficient, in view of the product yield of the semiconductor memory devices, to discard a semiconductor memory device having a small amount of the failed memory cells. To prevent such inefficiency, redundancy memory cells, as well as normal memory cells are additionally disposed in a semiconductor memory device.

When a normal memory cell fails, a redundancy memory cell may replace the failed normal memory cell, which is referred to as a repair-target memory cell. For example, when the repair-target memory cell is accessed during write and read operations, the redundancy memory cell is accessed instead of the repair-target memory cell. Therefore, when an address corresponding to the repair-target memory cell is received, the semiconductor memory device accesses not the repair-target memory cell but the redundancy memory cell. This is referred to as a repair operation and the semiconductor memory device may continue to stably operate through the repair operation.

For a repair operation, a semiconductor memory device needs a repair fuse circuit as well as redundancy memory cells. The repair fuse circuit stores addresses corresponding to repair-target memory cells, which are referred to as a repair-target addresses. The repair fuse circuit includes a plurality of fuses that may be programmed with the repair-target addresses. The semiconductor memory device performs the repair operation on the failed memory cells using the repair-target addresses programmed in the fuses.

The programming is a series of procedures to store information for example, repair-target addresses, into fuses. A fuse may be a physical type fuse or an electrical type fuse.

When programming the physical type fuse, the fuse may be cut by laser blowing according to information to be programmed. The physical type fuse is also referred to as a laser blowing type fuse since a laser beam is used for cutting. The physical type fuse may be programmed only in a wafer state that is, before being packaged.

When programming the electrical type fuse, the fuse may be ruptured by an overcurrent application according to information to be programmed. Electrical type fuses are classified into an anti-type fuse, which is in a short state when programmed, and a blowing type fuse, which is in an open state when programmed. The electrical type fuse may be programmed even in a package state, and therefore is generally used in the field of the semiconductor memory device design. Currently, a fuse array is frequently used as the repair fuse circuit.

FIG. 1 is a block diagram illustrating a conventional semiconductor memory device.

Referring to FIG. 1, the conventional semiconductor memory device includes a word line control section 110, a repair fuse section 120, a memory cell array 130, and a data input/output section 140.

The word line control section 110 controls a plurality of word lines NOR_WL<1:#> and RDN_WL<1:@> to be activated in response to an external address ADD_EXT and hitting information INF_HT<1:@>. The word lines NOR_WL<1:#> and RDN_WL<1:@> are divided into a plurality of normal word lines NOR_WL<1:#> corresponding to a normal memory cell array 131, and a plurality of redundancy word lines RDN_WL<1:@> corresponding to a redundancy memory cell array 132.

The repair fuse section 120 generates the hitting information INF_HT<1:@> by comparing the external address ADD_EXT, and repair-target addresses, which are programmed therein. The hitting information INF_HT<1:@> corresponds to the redundancy word lines RDN_WL<1:@>, and have information on an activation of the redundancy word lines RDN_WL<1:@> instead of the normal word lines NOR_WL<1:#>. As described above, the repair fuse section 120 is programmed with the repair-target address.

The memory cell array 130 includes a plurality of memory cells coupled to the normal word lines NOR_WL<1:#> of the normal memory cell array 131 and the redundancy word lines RDN_WL<1:@> of the redundancy memory cell array 132. The normal memory cell array 131 stores normal data, and the redundancy memory cell array 132 replaces the normal memory cell array 131 when the normal memory cell array 131 has one or more failed memory cells.

The data input/output section 140 exchanges data between the memory cell array 130 and an external. The data input/output section 140 transfers data DAT from the memory cell array 130 to the external during an read operation and from the external to the memory cell array 130 during a write operation.

Currently, new concerns in a semiconductor memory device, which were not an issue in the past, are brought up as the process technology and the design technology are developing. The semiconductor memory device takes various tests before being released into the market and the tests should be modified or augmented for the new concerns. A test operation is a major factor for the competiveness of semiconductor memory devices, and it may be important to optimize and effectively control the test.

SUMMARY

Various embodiments of the present invention are directed to a semiconductor memory device capable of performing a test operation on circuits related to a repair operation.

In accordance with an embodiment of the present invention, a semiconductor memory device may include a memory cell array including a plurality of word lines; a repair fuse section programmed with one or more repair-target addresses and fuse enable information; an address generation section suitable for generating test addresses during a test operation, corresponding to the word lines based on the repair-target addresses and the fuse enable information; and a word line control section suitable for selectively activating the word lines based on the test addresses.

The test operation may be performed for screening word line disturbance.

The memory cell array may include a normal cell array and a redundancy cell array.

The word line control section selectively may activate normal word lines corresponding to the normal memory cell array and redundancy word lines corresponding to the redundancy memory cell array based on the fuse enable information.

The test addresses may correspond to the normal word lines and the redundancy word lines during the test operation.

In accordance with an embodiment of the present invention, a method of operating a semiconductor memory device may include detecting one or more repair-target addresses; setting test-target normal word lines from a plurality of normal word lines based on the repair-target addresses; detecting fuse enable information; setting one or more test-target redundancy word lines from a plurality of redundancy word lines based on the fuse enable information; and performing a test operation on the test-target normal word lines and the test-target redundancy word lines.

The test operation may be performed for screening word line disturbance.

The performing of the test operation may include consecutively activating one word line selected from the test-target normal word lines and the test-target redundancy word lines; and outputting data corresponding to an adjacent word line, which is adjacent to the selected word line.

The set test-target normal word lines may exclude one or more normal word lines corresponding to the repair-target addresses.

The set test-target redundancy word lines may exclude one or more redundancy word lines, which are not used.

In accordance with an embodiment of the present invention, a semiconductor memory device may include a memory cell array including a plurality of word lines; a word line control section suitable for activating the word lines to output data stored in the memory cell array, during a test operation; a repair fuse section programmed with one or more repair-target addresses and fuse enable information; and a test output control section suitable for controlling test result value outputted from the memory cell array based on the fuse enable information during the test operation.

The test operation may be performed for screening word line disturbance.

The test output control section may output a predetermined result value instead of the test result value based on the fuse enable information.

The test output control section may include a multiplexer suitable for outputting the test result value or a predetermined result value based on the fuse enable information.

The semiconductor memory device may further include a data input/output section suitable for exchanging data with the memory cell array during a normal operation, and for outputting a value outputted from the test output control section during the test operation.

In accordance with an embodiment of the present invention, a method of operating a semiconductor memory device may include storing test data into a redundancy memory cell array including a plurality of redundancy word lines; consecutively activating a test-target redundancy word line of the redundancy word lines; outputting data of an adjacent redundancy word line adjacent to the test-target redundancy word line as a test result value; replacing the test result value with a predetermined result value according to whether or not to use the adjacent redundancy word line; and determining failure of the redundancy word lines based on the test result value.

Whether or not to use of the adjacent redundancy word line may be determined by fuse enable information.

The replacing of the test result may include determining whether or not to use the adjacent redundancy word line based on the fuse enable information; and outputting the predetermined result value according to determined result.

The predetermined result value may be the same as the test data.

In accordance with the embodiments of the present invention, the semiconductor memory device may effectively perform a test operation on circuits rented to a repair operation.

Reliability of write and read operations of a semiconductor memory device including circuits related to a repair operation may be secured by effectively performing a test operation on the circuits.

DETAILED DESCRIPTION

Figure 1:
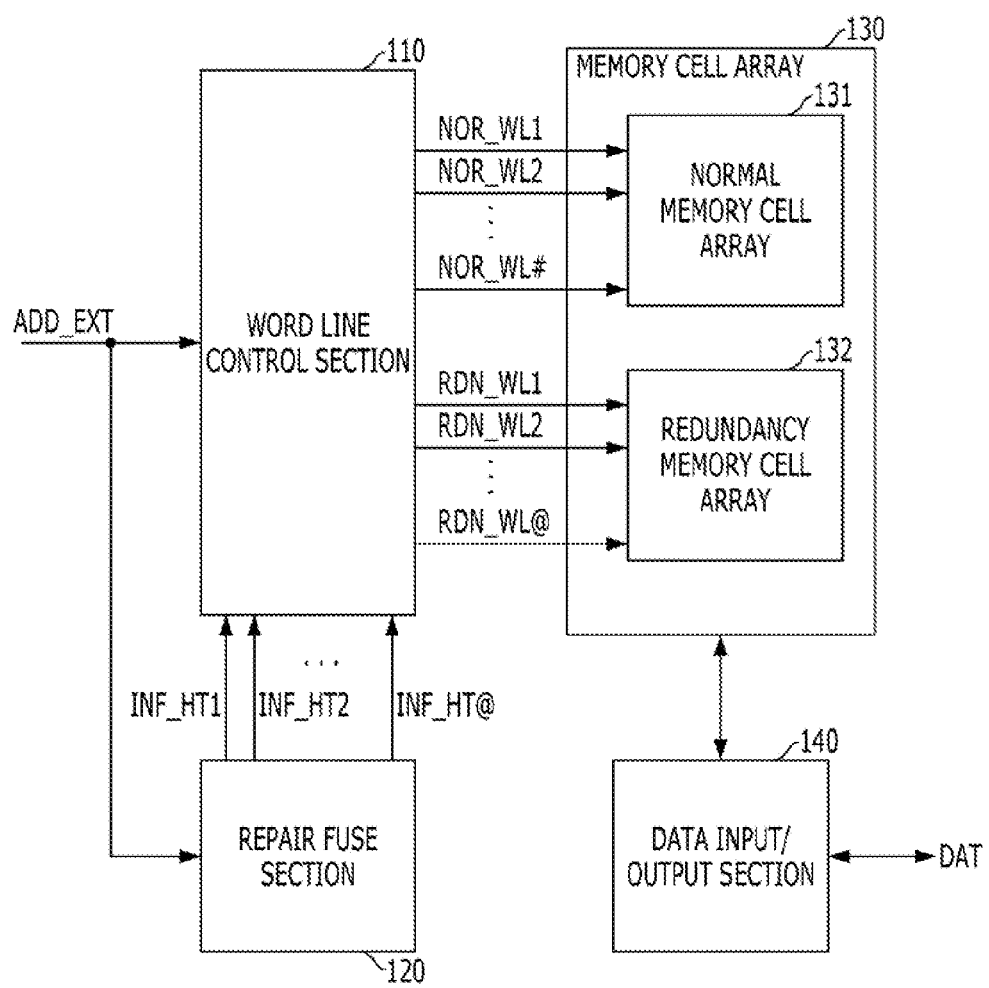
FIG. 1 is a block diagram illustrating a conventional semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough, complete and will fully convey the scope of the present invention to those skilled in the art. The drawings are not necessarily to scale and in some instances, proportions may have been exaggerated to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case in which the first layer is formed directly on the second layer or the substrate but also a case in which a third layer exists between the first layer and the second layer or the substrate.

Figure 2:
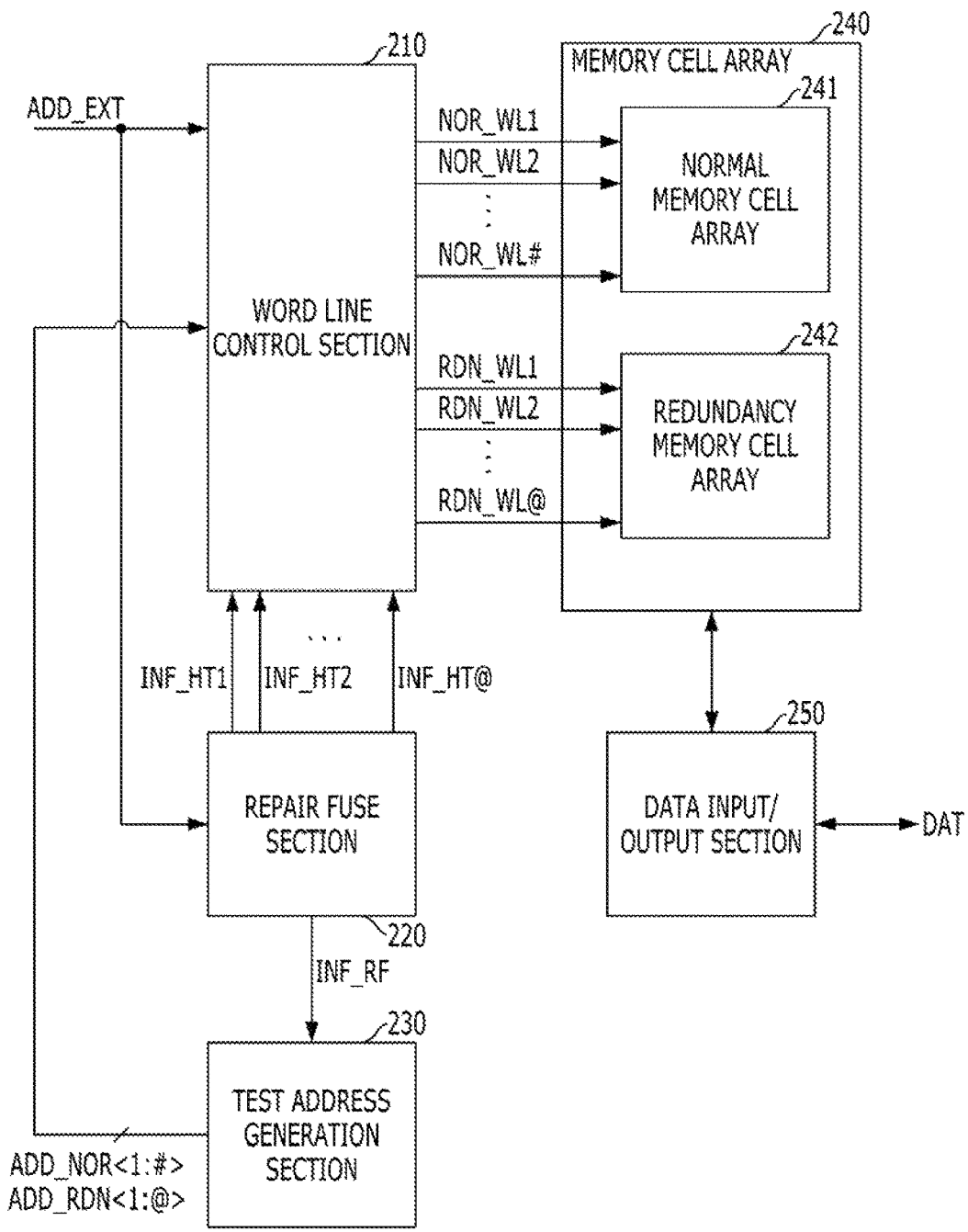
FIG. 2 is a block diagram illustrating a semiconductor memory device in accordance with an embodiment of the present invention.

FIG. 2 is a block diagram illustrating a semiconductor memory device in accordance with an embodiment of the present invention.

Referring to FIG. 2, the semiconductor memory device includes a word line control section 210, a repair fuse section 220, a test address generation section 230, a memory cell array 240, and a data input/output section 250.

During a normal operation, the word line control section 210 may control a plurality of word lines NOR_WL<1:#> and RDN_WL<1:@> to be activated in response to an external address ADD_EXT and hitting information INF_HT<1:@>. The word lines NOR_WL<1:#> and RDN_WL<1:@> may be divided into a plurality of normal word lines NOR_WL<1:#> corresponding to a normal memory cell array 241, and a plurality of redundancy word lines RDN_WL<1:@> corresponding to a redundancy memory cell array 242.

During a test operation the word line control section 210 may control the word lines NOR_WL<1:#> and RDN_WL<1:@> to be activated in response to test normal addresses ADD_NOR<1:#> and test redundancy addresses ADD_RDN<1:@>.

During the normal operation, the repair fuse section 220 may generate the hitting information INF_HT<1:@> by comparing the external address ADD_EXT, and repair-target addresses, which are programmed therein. The hitting information INF_HT<1:@> may correspond to the redundancy word lines RDN_WL<1:@>, and have information on an activation of the redundancy word lines RDN_WL<1:@> instead of the normal word lines NOR_WL<1:#>. Hereinafter, the repair-target addresses may be referred to as a repair-target address for convenience of the description.

During the test operation, the repair fuse section 220 may provide programmed information INF_RF to the test address generation section 230. The programmed information INF_RF may include information corresponding to a repair-target address, and information on whether or not to use the repair-target address, such as, fuse enable information.

The test address generation section 230 may generate the test normal addresses ADD_NOR<1:#> and the test redundancy addresses ADD_RDN<1:@> for the activation of the word lines NOR_WL<1:#> and RDN_WL<1:@> based on the programmed information INF_RF provided by the repair fuse section 220. As described above, during the test operation, the word line control section 210 may control the word lines NOR_WL<1:#> and RDN_WL<1:@> to be activated in response to the test normal addresses ADD_NOR<1:#> and the test redundancy addresses ADD_RDN<1:@>.

The memory cell array 240 includes a plurality of memory cells coupled to the normal word lines NOR_WL<1:#> of the normal memory cell array 241 and the redundancy word lines RDN_WL<1:@> of the redundancy memory cell array 242. The normal memory cell array 241 may store normal data, and the redundancy memory cell array 242 may replace the normal memory cell array 241 when the normal memory cell array 241 has one or more failed memory cells.

The data input/output section 250 may exchange data between the memory cell array 240 and an external. The data input/output section 250 may transfer data DAT from the memory cell array 240 to the external during a read operation and from the external to the memory cell array 240 during a write operation.

The semiconductor memory device may control the word lines NOR_WL<1:#> and RDN_WL<1:@> to be activated in response to the programmed information INF_RF provided by the repair fuse section 220 during the test operation. That is, the repair-target address and programming state information of the repair-target address, that is, fuse enable information, may be programmed in the repair fuse section 220. Therefore, during the test operation on the normal memory cell array 241, the semiconductor memory device may perform the test operation on the normal word lines NOR_WL<1:#> except for the normal word lines corresponding to the repair-target address based on the programmed information INF_RF. Additionally, during the test operation on the redundancy memory cell array 242, the semiconductor memory device may perform the test operation on the redundancy word lines RDN_WL<1:@> according to whether or not to use the repair-target address of the redundancy word lines RDN_WL<1:@>, that is, according to fuse enable information. Such selection of the test target word lines may optimize the test operation and the test time.

A semiconductor memory device generally includes a plurality of memory banks for storing data, and each of the memory banks has more than tens of millions of memory cells. Each of the memory cells comprises a cell capacitor and a cell transistor, and the semiconductor memory device stores information by charging and discharging the cell capacitor. Ideally, an amount of charges stored in the cell capacitor is supposed to remain unchanged. However, realistically the amount of charges stored in the cell capacitor changes due to a voltage difference in peripheral circuits. That is, there may be an outflow of charges when the cell capacitor is charged, or there may be inflow of charges when the cell capacitor is discharged. As such, the change of the amount of charges corresponds to a change of data stored in the cell capacitor, and thus a loss of data stored in the cell capacitor. The semiconductor memory device performs refresh operations to prevent the loss of data stored in the cell capacitor.

Since the process technology of the semiconductor memory device is developing, the degree of integration of a semiconductor memory device increases. The increase of the degree of the semiconductor memory device affects the size of the memory bank. As the size of the memory bank becomes smaller, an interval between the memory cells is reduced. As the interval between the memory cells s reduced, an interval between a plurality of word lines, which are coupled to neighbouring memory cells respectively, is reduced. Currently, new concerns about the interval between the word lines, which was not an issue in the past, are brought up as the interval between the word lines becomes reduced. One of the new concerns about the interval between the word lines is a coupling effect. As the interval between the word lines is reduced, the coupling effect between adjacent word lines increases.

Whenever data is inputted and outputted to and from a memory cell, a word line toggles between an activated or active state and a deactivated or inactive state. In this regard, the coupling effect between adjacent word lines increases as the interval between the word lines is reduced. Thus, a phenomenon occurs in which a data of a memory cell connected with a word line adjacent to a frequently activated word line is damaged. Such a phenomenon is called word line disturbance. Due to the word line disturbance, the data of a memory cell coupled to the adjacent word line may be damaged, which may raise the probability of data loss.

In accordance with the embodiments of the present invention, the semiconductor memory device may effectively perform a test operation for screening for word line disturbance. Hereinafter, the test operation for screening for word line disturbance will be described in more detail. For convenience of the description, a test operation of the normal memory cell array 241 will be described with reference to FIG. 3, and a test operation of the redundancy memory cell array 242 will be described with reference to FIG. 4.

Figure 3:
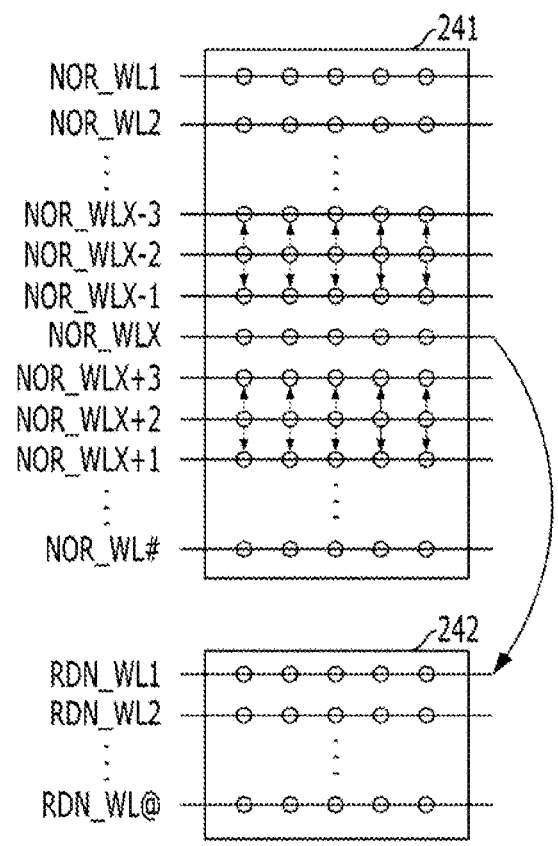
FIG. 3 is a diagram for describing a test operation of a normal memory cell array shown in FIG. 2.

FIG. 3 is a diagram for describing a test operation of the normal memory cell array 241 shown in FIG. 2.

FIG. 3 shows the normal memory cell array 241 and the redundancy memory cell array 242 described with reference to FIG. 2. For convenience, it is presumed that a single normal word line NOR_WLx of the normal memory cell array 241 is replaced by a single redundancy word line RDN_WL1 of the redundancy memory cell array 242.

Referring to FIGS. 2 and 3, during the test operation, the repair fuse section 220 may provide the information corresponding to the repair-target address of the programmed information INF_RF to the test address generation section 230. That is, the test address generation section 230 may receive the address corresponding to the normal word line NOR_WLx, and generate the test normal addresses ADD_NOR<1#> accordingly.

When the semiconductor memory device performs the test operation on a normal word line NOR_WL2 of the normal memory cell array 241, the semiconductor memory device may perform the test operation by activating adjacent word lines adjacent to the normal word line NOR_WL2 and outputting data from the adjacent word lines after sufficiently repeating the active operation and the precharge operation on the normal word line NOR_WL2 by a predetermined number of times. When the data is normally outputted from the adjacent word lines, the repetitive active operations to the normal word line NOR_WL2 do not cause a coupling effect to the adjacent word lines. When the data is abnormally outputted from the adjacent word lines, the repetitive active operations to the normal word line NOR_WL2 do cause a coupling effect to the adjacent word lines.

As described above, the test address generation section 230 may receive the address information corresponding to the normal word line NOR_WLx from the repair fuse section 220, and generate the test normal addresses ADD_NOR<1:#> so that the test operation may be performed to the normal word lines NOR_WL<1:#> except for the normal word line NOR_WLx. That is, test operation may be performed to normal word lines NOR_WLx−3 and NOR_WLx−1, which are adjacent to the normal word line NOR_WL−2, by outputting data from the normal word lines NOR_WLx−3 and NOR_WLx−1 after the consecutive and repetitive active operations to the normal word line NOR_WL−2. Then, the test operation may be performed to normal word lines NOR_WLx+3 and NOR_WLx+1, which are adjacent to the normal word line NOR_WL+2, by outputting data from the normal word lines NOR_WLx+3 and NOR_WLx+1 after the consecutive and repetitive active operations to the normal word line NOR_WL+2.

In accordance with the embodiments of the present invention, the semiconductor memory device may optimize the test operation and the test time to the normal memory cell array 241 by performing the test operation on the normal word lines NOR_WL<1:#> except for the normal word line corresponding to the repair-target address, which is provided during the test operation on the normal memory cell array 241.

Figure 4:
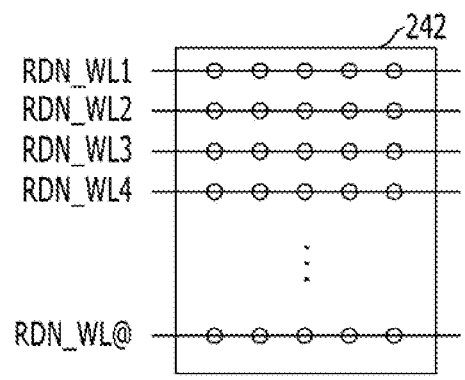
FIG. 4 is a diagram for describing a test operation of a redundancy memory cell array shown in FIG. 2.

FIG. 4 is a diagram for describing a test operation of the redundancy memory cell array 242 shown in FIG. 2. For convenience, it is presumed that the semiconductor memory device does not use the single redundancy word line RDN_WL1. The semiconductor memory device may not use the redundancy word line RDN_WL1 when one of the fuses included in the repair fuse section 220 corresponding to the redundancy word line RDN_WL1 is not programmed with the repair-target address, or when the redundancy word line RDN_WL1 is discarded, for example, due to failure, even though one of the fuses included in the repair fuse section 220 corresponds to the redundancy word line RDN_WL1 and is programmed with the repair-target address that may correspond to whether or not to use the redundancy word line.

Referring to FIGS. 2 and 4, the repair fuse section 220 may provide information corresponding to whether or not to use the repair-target address, that is, fuse enable information, included in the programmed information INF_RF to the test address generation section 230. The test address generation section 230 may receive the information about whether or not to use the redundancy word line RDN_WL1, and may generate the redundancy word lines RDN_WL<1:@> accordingly.

Similar to the normal memory cell array 241, the redundancy memory cell array 242 may perform the test operation on the redundancy word lines RDN_WL<1:@> except for the redundancy word line RDN_WL1. Since the test address generation section 230 receives the information about whether or not to use the redundancy word line RDN_WL1 from the repair fuse section 220, the test redundancy addresses ADD_RDN<1:@> may be generated so that the test operation may be performed to the redundancy word lines RDN_WL<1:@> except for the redundancy word line RDN_WL1. That is, test operation may be performed to redundancy word lines RDN_WL2 and RDN_WL4, which are adjacent to the redundancy word line RDN_WL3, by outputting data from the redundancy word lines RDN_WL2 and RDN_WL4 after the consecutive and repetitive active operations to the redundancy word line RDN_WL3. Then, the test operation may be performed to other redundancy word lines.

In accordance with the embodiments of the present invention, the semiconductor memory device may optimize the test operation and the test time to the redundancy memory cell array 242 by performing the test operation on the redundancy word lines RDN_WL<1:@> except for the redundancy word line which is not used, based on the information of the use of the repair-target address included in the programmed information INF_RF, which is provided by the repair fuse section 220 during the test operation on the redundancy memory cell array 242.

Figure 5:
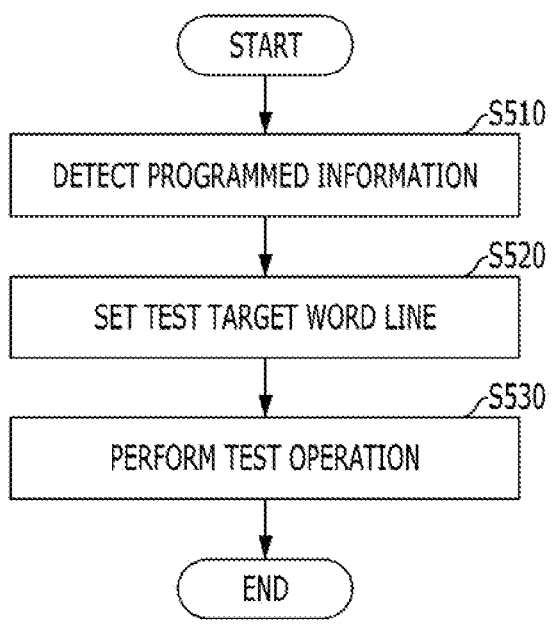
FIG. 5 is a flow chart illustrating a test operation of the semiconductor memory device shown in FIGS. 2 to 4.

FIG. 5 is a flow chart illustrating a test operation of the semiconductor memory device shown in FIGS. 2 to 4.

Referring to FIGS. 2 to 5, the test operation of the semiconductor memory device may include steps of detecting the programmed information INF_RF (S510), setting the test-target word line (S520), and performing the test operation (S530).

Step S510 is the detecting of the programmed information INF_RF. In step S510, the repair fuse section 220 described with reference to FIG. 2 may detect the repair-target address for the test operation on the normal memory cell array 241, and provide the repair-target address to the test address generation section 230. Also, in step S510, the repair fuse section 220 may detect the information, that is, fuse enable information, on whether or not to use the repair-target address, that is, whether or not to use the repair-target word line, for the test operation on the redundancy memory cell array 242 and provide the information on whether or not to use the repair-target address, that is, whether or not to use the repair-target word line, to the test address generation section 230.

Step S520 is the setting of the test-target word line. In step S520, the test address generation section 230 described with reference to FIG. 2 may receive the programmed information INF_RF, that is, the repair-target address, and generate the test normal addresses ADD_NOR<1:#> by setting a normal word line, which is activated during the test operation, and is referred to as a test-target normal word line, from the normal word lines NOR_WL<1:#>. Also, in step S520, the test address generation section 230 may receive the programmed information INF_RF, that is, the information on whether or not to use the repair-target address, and generate the test redundancy addresses ADD_RDN<1:@> by setting a redundancy word line, which is activated during the test operation, and is referred to as a test-target redundancy word line from the redundancy word lines RDN_WL<1:@>.

Step S530 is the performing of the test operation. In step S530, the semiconductor memory device may perform the test operation on the test-target normal word line and the test-target redundancy word line, which are set in step S520. As described above, the test operation may be performed by consecutively and repetitively activating the corresponding word line, and outputting data from the adjacent word line, thereby checking failure of the activated word line and the adjacent word line.

Figure 6:
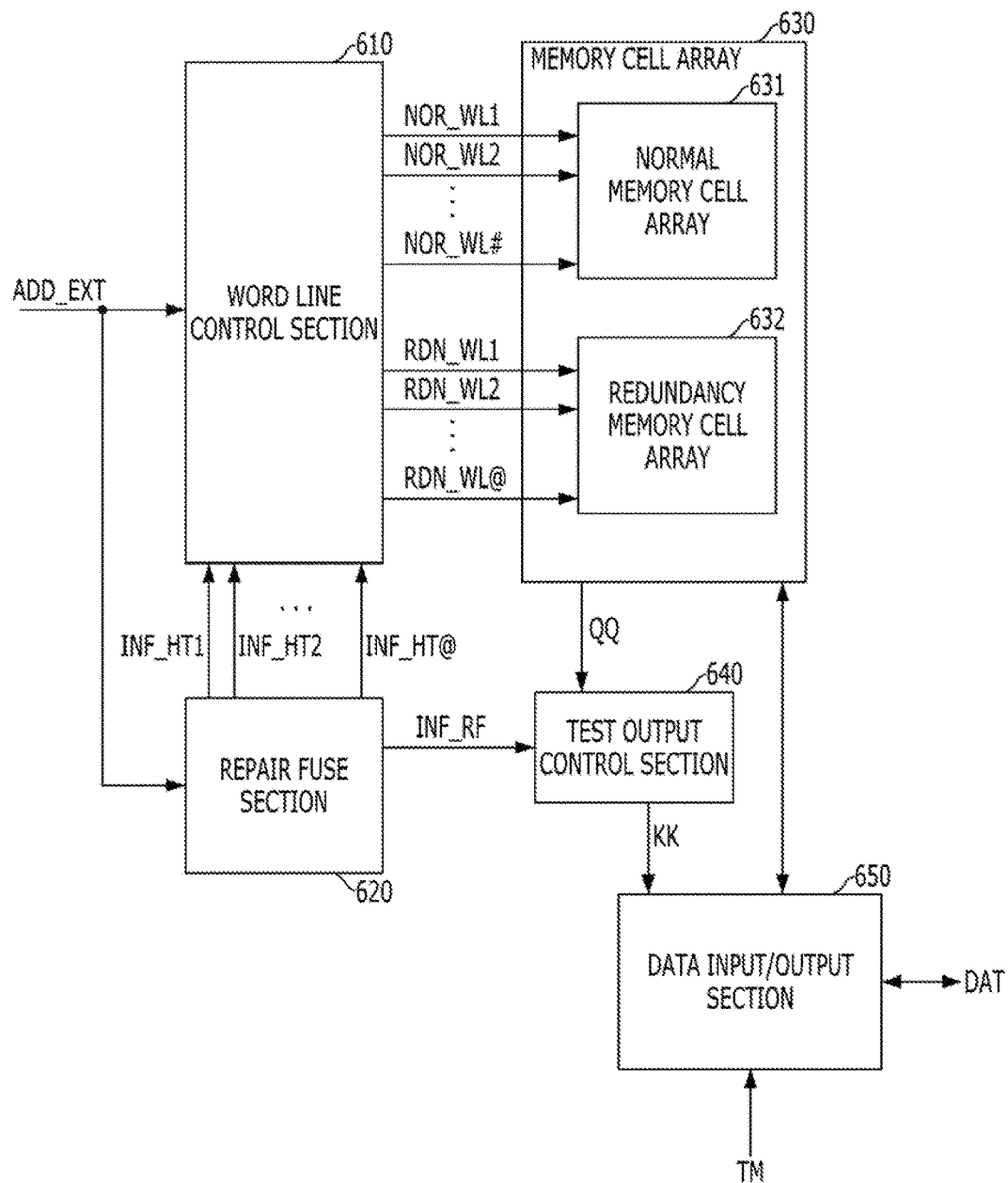
FIG. 6 is a block diagram illustrating a semiconductor memory device in accordance with an embodiment of the present invention.

FIG. 6 is a block diagram illustrating a semiconductor memory device in accordance with an embodiment of the present invention.

Referring to FIG. 6, the semiconductor memory device includes a word line control section 610, a repair fuse section 620, a memory cell array 630, a test output control section 640, and a data input/output section 650. The word line control section 610, the repair fuse section 620, and the memory cell array 630 shown in FIG. 6 may correspond to the word line control section 210, the repair fuse section 220, and the memory cell array 230 described with reference to FIG. 2, respectively. Therefore, the description for the elements shown in FIG. 6 corresponding to the elements described with reference to FIG. 2 will be omitted, and different elements will be described hereinafter with reference to FIG. 6.

The semiconductor memory device shown in FIG. 6 may not have the test address generation section 230 described with reference to FIG. 2, and may further have the test output control section 640. The test output control section 640 may control test result value QQ outputted from the memory cell array 630 in response to the programmed information INF_RF provided by the repair fuse section 620. The programmed information INF_RF may only include the information about whether or not to use the repair-target address, that is, fuse enable information.

The data input/output section 650 may receive and output an output signal KK of the test output control section 640 in response to a test signal TM, which is enabled during the test operation. The data input/output section 650 may transfer data between the memory cell array 630 and an external during the normal operation. The data input/output section 650 may transfer data DAT from the memory cell array 630 to the external during the read operation and from the external to the memory cell array 630 during the write operation.

In accordance with the embodiments of the present invention, the semiconductor memory device may adjust or replace the test result value QQ, which is outputted from the memory cell array 630, to a predetermined result value, and output the adjusted value in response to the programmed information INF_RF during the test operation.

Furthermore the semiconductor memory device may not use the redundancy word line when one of the fuses included in the repair fuse section 620 corresponding to the redundancy word line is not programmed with the repair-target address, or when the redundancy word line is discarded, for example, due to failure although one of the fuses included in the repair fuse section 620 corresponding to the redundancy word line that is programmed with the repair-target address, which may indicates whether or not to use the corresponding redundancy word line. Therefore, when the redundancy word line which is not used, becomes the adjacent word line, garbage data may be outputted from the adjacent word line, which makes the test operation unreliable. Therefore, there is need to adjust the garbage data outputted from the unused redundancy word line as the adjacent word line to the predetermined result value, which is met by the semiconductor memory device in accordance with an embodiment of the present invention.

Figure 7:
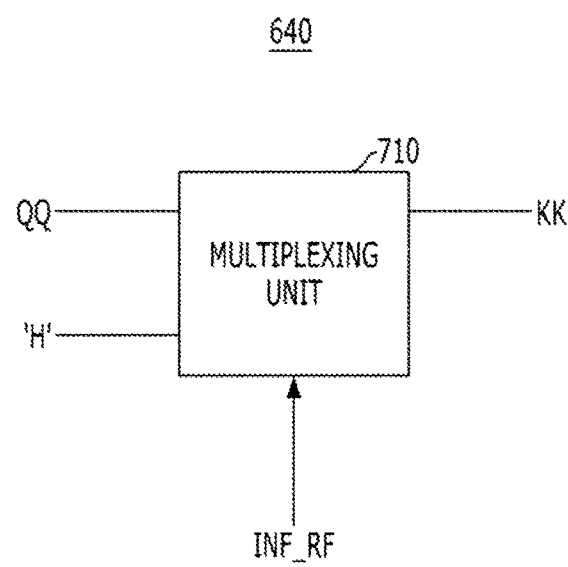
FIG. 7 is a detailed block diagram of a test output control section shown in FIG. 6.

FIG. 7 is a detailed block diagram of the test output control section 640 shown in FIG. 6.

Referring to FIG. 7, the test output control section 640 may output one of the test result value QQ and a value of logic "HIGH" H as the output signal KK in response to the programmed information INF_RF. The value of logic "HIGH" H may correspond to the test result indicating normality of the test-target redundancy word line.

Figure 8:
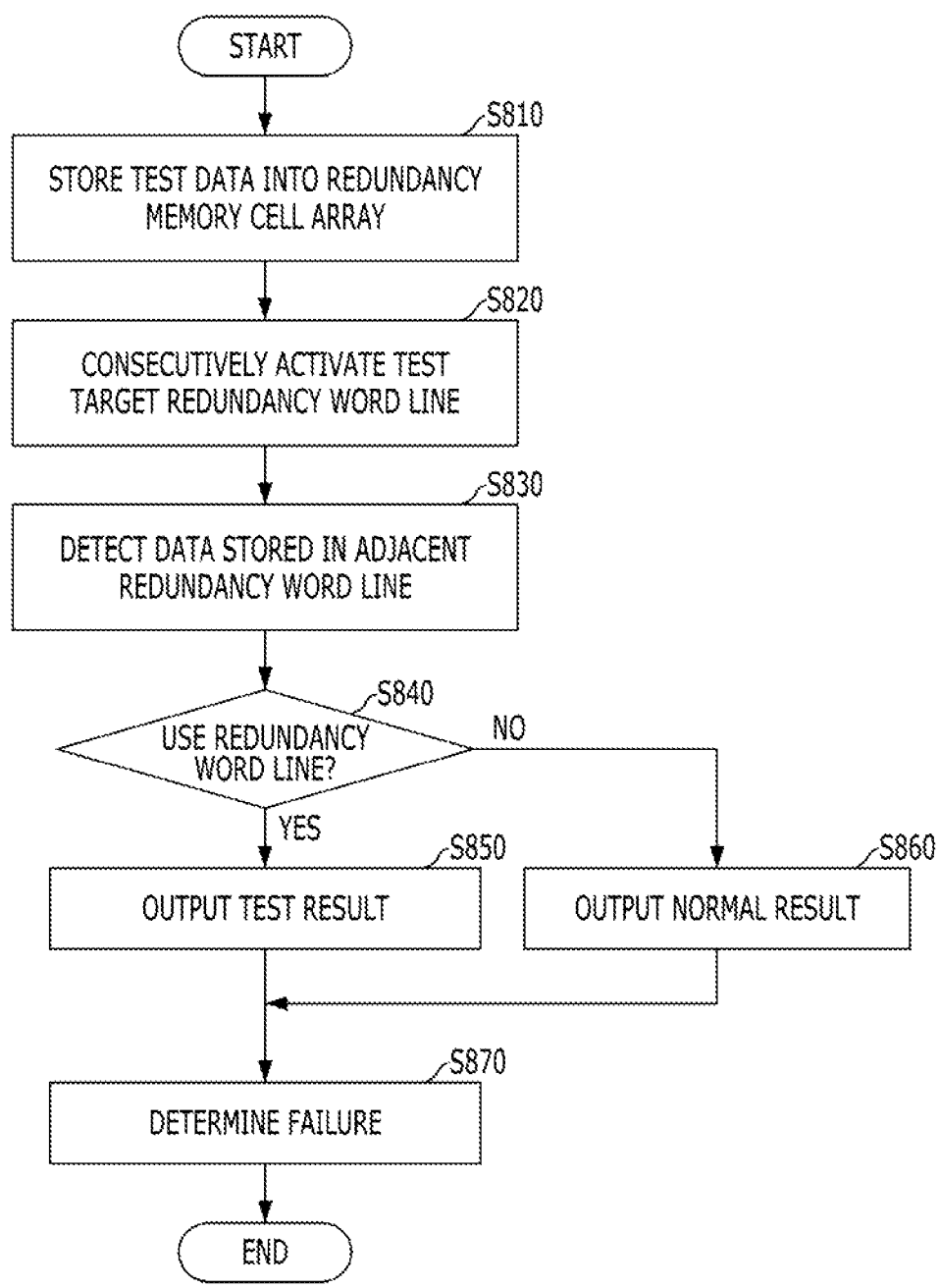
FIG. 8 is a flow chart illustrating a test operation of the semiconductor memory device shown in FIGS. 6 and 7.

FIG. 8 is a flow chart illustrating a test operation of the semiconductor memory device shown in FIGS. 6 and 7.

Referring to FIG. 8, the test operation of the semiconductor memory device may include steps of storing test data into a redundancy memory cell array (S810), consecutively activating a test target redundancy word line (S820), detecting data stored in an adjacent redundancy word line (S830), determining whether or not to use the redundancy word line (S840), outputting a test result (S850), outputting a normal result (S860), and determining failure (S870).

The test operation of the semiconductor memory device will be described hereinafter with reference to FIGS. 6 to 8. For convenience, it is presumed that the redundancy memory cell array 632 shown in FIG. 6 may perform direct access operation during the test operation. During the direct access operation, the redundancy memory cell array 632 may selectively activate one of the redundancy word lines RDN_WL<1:@> included in the redundancy memory cell array 632.

Step S810 is the storing of the test data into the redundancy memory cell array 632 to be tested. The redundancy memory cell array 632 may store predetermined test data. For example, the redundancy memory cell array 632 may store the value of logic "HIGH" H described with reference to FIG. 7. When the value of logic "HIGH" H is detected, the corresponding redundancy word line is determined to be normal.

Step S820 is consecutively activating the test target redundancy word line. When the adjacent redundancy word line adjacent to the consecutively activated redundancy word line fails, the adjacent redundancy word line may not keep the value of logic "HIGH" H due to the consecutive activation of the test target redundancy word line.

Step S830 is the detecting of data stored in the adjacent redundancy word line. The data stored in the adjacent redundancy word line adjacent to the consecutively activated test target redundancy word line is detected. As described above, when the adjacent redundancy word line fails, a value of logic "LOW" L will be detected, and when the adjacent redundancy word line is normal, the value of logic "HIGH" H will be detected.

Step S840 is the determining of whether or not to use the redundancy word line according to the programmed information INF_RF provided by the repair fuse section 620. When the corresponding redundancy word line is used, step S850 may be processed, and when the corresponding redundancy word line is not used, step S860 may be processed. The programmed information INF_RF may only include information about whether or not to use the repair-target address.

Step S850 is the outputting of the test result. When the corresponding redundancy word line is used, data detected at step S840 may be outputted. Additionally, step S860 is the outputting of the normal result. When the corresponding redundancy word line is not used, the predetermined result value, that is, the value of logic "HIGH" H, instead of data detected at step S840 may be outputted.

Step S870 is the determining of a failure. The test results outputted through steps S850 and S860 may be analyzed, and it may be determined whether or not the redundancy word lines RDN_WL<1:@> included in the redundancy memory cell array 632 fail.

In accordance with the embodiments of the present invention, through steps S840, S850, and S860, the semiconductor memory device may output the data stored in the redundancy word line which is used as the test result, and output the predetermined result value as to the redundancy word line which is not used as the test result. That is, the semiconductor memory device may adjust or change the test value according to use of the redundancy word line, and may receive expected test result.

As described above, in accordance with various embodiments of the present invention, the semiconductor memory device may program the repair-target address for the repair operation, and may effectively control the test operation using the programmed information. Particularly, the test operation may be performed to the word lines except for some word lines according to the programmed information. Additionally, the semiconductor memory device may perform the test operation on the word lines while the semiconductor memory device may adjust the test value to the predetermined result value as to the redundancy word line which is not used, according to the programmed information.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
    a memory cell array including a plurality of word lines, wherein the memory cell array includes a normal memory cell array and a redundancy memory cell array;
    a repair fuse section programmed with one or more repair-target addresses and fuse enable information;
    an address generation section suitable for generating test normal addresses and test redundancy addresses during a test operation, corresponding to normal word lines and redundancy word lines of the plurality of word lines based on the repair-target addresses and the fuse enable information; and
    a word line control section suitable for selectively activating the word lines based on the test addresses,
    wherein the test operation on the redundancy word lines except for redundancy word lines that are not used, is selectively performed based on use information of the repair-target addresses during the test operation on the redundancy memory cell array.

2. The semiconductor memory device of claim 1, wherein the test operation is performed for screening word line disturbance.

3. The semiconductor memory device of claim 1, wherein the word line control section selectively activates normal word lines corresponding to the normal memory cell array and redundancy word lines corresponding to the redundancy memory cell array based on the fuse enable information.

4. The semiconductor memory device of claim 3, wherein the test addresses correspond to the normal word lines and the redundancy word lines during the test operation.

5. A method of operating a semiconductor memory device comprising:
    detecting one or more repair-target addresses;
    generating a test normal address by setting test-target normal word lines from a plurality of normal word lines based on the repair-target addresses;
    detecting fuse enable information;
    generating a test redundancy address by setting one or more test-target redundancy word lines from a plurality of redundancy word lines based on the fuse enable information; and
    performing a test operation on the test-target normal word lines and the test-target redundancy word lines,
    wherein the test operation on the test-target redundancy word lines except for test-target redundancy word lines that are not used, is selectively performed based on use information of the repair-target addresses during the test operation on a redundancy memory cell array.

6. The method of claim 5, wherein the test operation is performed for screening word line disturbance.

7. The method of claim 6, wherein the performing of the test operation comprises:
    consecutively activating one word line selected from the test-target normal word lines and the test-target redundancy word lines; and
    outputting data corresponding to an adjacent word line, which is adjacent to the selected word line.

8. The method of claim 6, wherein the set test-target normal word lines exclude one or more normal word lines corresponding to the repair-target addresses.

9. The method of claim 6, wherein the set test-target redundancy word lines exclude one or more redundancy word lines, which are not used.

10. A semiconductor memory device comprising:
    a memory cell array including normal word lines and redundancy word lines of a plurality of word lines, wherein the memory cell array includes a normal memory cell array and a redundancy memory cell array;
    a word line control section suitable for activating the word lines to output data stored in the memory cell array, during a test operation;

a repair fuse section programmed with one or more repair-target addresses and fuse enable information; and a test output control section suitable for controlling test result value outputted from the memory cell array based on the fuse enable information during the test operation, wherein the test operation on the redundancy word lines except for redundancy word lines that are not used, is selectively performed based on use information of the repair-target addresses during the test operation on the redundancy memory cell array.

11. The semiconductor memory device of claim 10, wherein the test operation is performed for screening word line disturbance.

12. The semiconductor memory device of claim 10, wherein the test output control section outputs a predetermined result value instead of the test result value based on the fuse enable information.

13. The semiconductor memory device of claim 10, wherein the test output control section includes a multiplexer suitable for outputting the test result value or a predetermined result value based on the fuse enable information.

14. The semiconductor memory device of claim 10, further comprising a data input/output section suitable for exchanging data with the memory cell array during a normal operation, and for outputting a value outputted from the test output control section during the test operation.

15. A method of operating a semiconductor memory device comprising:

storing test data into a redundancy memory cell array including a plurality of redundancy word lines;

consecutively activating a test-target redundancy word line of the redundancy word lines;

outputting data of an adjacent redundancy word line adjacent to the test-target redundancy word line as a test result value;

replacing the test result value with a predetermined result value according to whether or not to use the adjacent redundancy word line; and determining failure of the redundancy word lines based on the test result value, wherein a test operation on the redundancy word lines except for redundancy word lines that are not used, is selectively performed based on use information of a repair-target address during a test operation on the redundancy memory cell array.

16. The method of claim 15, wherein whether or not to use of the adjacent redundancy word line is determined by fuse enable information.

17. The method of claim 16, wherein the replacing of the test result comprises:

determining whether or not to use the adjacent redundancy word line based on the fuse enable information; and outputting the predetermined result value according to determined result.

18. The method of claim 15, wherein the predetermined result value is the same as the test data.

* * * * *